(12) United States Patent
Zhao

(10) Patent No.: US 10,163,811 B2
(45) Date of Patent: Dec. 25, 2018

(54) SEMICONDUCTOR PACKAGE STRUCTURE BASED ON CASCADE CIRCUITS

(71) Applicant: Gpower Semiconductor, Inc., Suzhou (CN)

(72) Inventor: Shufeng Zhao, Suzhou (CN)

(73) Assignee: GPOWER SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 15/251,594

(22) Filed: Aug. 30, 2016

(65) Prior Publication Data

US 2017/0186700 A1 Jun. 29, 2017

(30) Foreign Application Priority Data

Dec. 25, 2015 (CN) .......................... 2015 1 0991622

(51) Int. Cl.
*H01L 23/552* (2006.01)
*H01L 25/065* (2006.01)
(Continued)

(52) U.S. Cl.
CPC .......... *H01L 23/552* (2013.01); *H01L 23/057* (2013.01); *H01L 23/3735* (2013.01); *H01L 23/642* (2013.01); *H01L 23/645* (2013.01); *H01L 23/647* (2013.01); *H01L 24/48* (2013.01); *H01L 25/0655* (2013.01); *H01L 29/16* (2013.01); *H01L 29/2003* (2013.01); *H01L 29/205* (2013.01); *H01L 29/7787* (2013.01); *H01L 29/7805* (2013.01); *H01L 23/49562* (2013.01); *H01L 24/49* (2013.01); *H01L 25/16* (2013.01); *H01L 29/4175* (2013.01);
(Continued)

(58) Field of Classification Search
CPC ................................................. H01L 23/49844
See application file for complete search history.

(56) References Cited

U.S. PATENT DOCUMENTS

2011/0193619 A1* 8/2011 Parikh ................. H01L 21/8258
327/534
2012/0235209 A1* 9/2012 Briere ................. H01L 27/0605
257/194

(Continued)

*Primary Examiner* — Latanya N Crawford
(74) *Attorney, Agent, or Firm* — Flener IP & Business Law; Zareefa B. Flener

(57) ABSTRACT

A semiconductor package structure comprises: a high-voltage depletion type semiconductor transistor comprising a source electrode, a gate electrode and a drain electrode; a low-voltage enhancement type semiconductor transistor comprising a source electrode, a gate electrode and a drain electrode; a shell comprising a cavity for receiving the high-voltage depletion type semiconductor transistor and the low-voltage enhancement type semiconductor transistor, and a high-voltage terminal, a first low-voltage terminal and a second low-voltage terminal; and cascade circuits comprising a supporting sheet having a conductive surface. The source electrode of the high-voltage depletion type transistor and the drain electrode of the low-voltage enhancement type semiconductor transistor are fixed to the conductive surface of the supporting sheet and electrically connected to each other through the conductive surface of the supporting sheet. A side of the supporting sheet away from the conductive surface is fixed to the cavity of the shell.

16 Claims, 5 Drawing Sheets

(51) Int. Cl.
  *H01L 23/057* (2006.01)
  *H01L 23/373* (2006.01)
  *H01L 23/64* (2006.01)
  *H01L 23/00* (2006.01)
  *H01L 29/16* (2006.01)
  *H01L 29/20* (2006.01)
  *H01L 29/205* (2006.01)
  *H01L 29/778* (2006.01)
  *H01L 29/78* (2006.01)
  *H01L 23/495* (2006.01)
  *H01L 29/417* (2006.01)
  *H01L 25/16* (2006.01)

(52) U.S. Cl.
  CPC .............. *H01L 29/7786* (2013.01); *H01L 2224/04042* (2013.01); *H01L 2224/32225* (2013.01); *H01L 2224/48137* (2013.01); *H01L 2224/48195* (2013.01); *H01L 2224/48227* (2013.01); *H01L 2224/48247* (2013.01); *H01L 2224/48257* (2013.01); *H01L 2224/48265* (2013.01); *H01L 2224/49111* (2013.01); *H01L 2224/73267* (2013.01); *H01L 2924/00014* (2013.01); *H01L 2924/19041* (2013.01); *H01L 2924/19043* (2013.01); *H01L 2924/19104* (2013.01); *H01L 2924/3025* (2013.01)

(56) References Cited

U.S. PATENT DOCUMENTS

| | | | |
|---|---|---|---|
| 2014/0225124 A1* | 8/2014 | Otremba | H01L 23/49844 257/77 |
| 2014/0225162 A1* | 8/2014 | Briere | H01L 21/8252 257/195 |
| 2016/0071781 A1* | 3/2016 | Sheridan | H01L 23/345 257/705 |
| 2016/0086878 A1* | 3/2016 | Otremba | H01L 23/49575 257/139 |
| 2016/0190114 A1* | 6/2016 | Huang | H01L 25/18 257/76 |
| 2016/0247792 A1* | 8/2016 | Chang | H01L 23/49562 |
| 2017/0025328 A1* | 1/2017 | Liu | H01L 29/2003 |

* cited by examiner

SEMICONDUCTOR PACKAGE STRUCTURE BASED ON CASCADE CIRCUITS

CROSS-REFERENCE TO RELATED APPLICATION

This application claims priority from and the benefit of Chinese Patent Application No. 201510991622.X, filed on Dec. 25, 2015, which is hereby incorporated by reference for all purposes as if fully set forth herein.

TECHNICAL FIELD

Embodiments of the present invention relate to semiconductor technology, and more particularly to a semiconductor package structure based on cascade circuits.

BACKGROUND

Currently, transistors used in power electronic devices are mainly traditional silicon devices, such as Si CoolMOSs, Si IGBTs, Si MOSFETs and the like. However, with rapid development of power device technology, power devices based on conventional Si and the second-generation semiconductor materials cannot meet the requirements of high speed and low loss in practical applications. Instead, SiC power devices have drawn high attentions in the field due to advantages of their material. Meanwhile, the third-generation semiconductor devices with wide band gaps, in particular, gallium nitride power devices, have become a hot topic of research and have been widely used in fields of radio frequency and power electronics. This is because, on the one hand, that gallium nitride is a kind of semiconductor material having a wide band gap which has a critical breakdown electric field 10 times larger than that of silicon material and correspondingly has a property of withstanding high voltages, and, on the other hand, that a two-dimensional electron gas channel is capable of providing a very small on-resistance so that power loss of a switching device can be reduced. Therefore, planar transistors based on aluminum gallium nitride/gallium nitride heterostructures have become an important research object in the field.

In practical applications of high-voltage power devices, in order to ensure safety of operating systems and application environments, normally-off type devices, i.e. devices having no output current when zero voltage is applied to gate electrodes thereof, are widely used. However, due to characteristics of the aluminum gallium nitride/gallium nitride heterojunction material, depletion type devices are more easily realized.

Currently, in order to produce a normally-off type gallium nitride device, as described in U.S. Patent Publication No. US20140167822 A1, a solution is to connect a high-voltage depletion type device and a low-voltage enhancement type device with cascade circuits. In detail, a source electrode of the high-voltage depletion type device is connected to a drain electrode of the low-voltage enhancement type device via a wire, and a gate electrode of the high-voltage depletion type device and a source electrode of the low-voltage enhancement type device are connected via a wire and function as a source electrode of the semiconductor package structure collectively. Therefore, a drain voltage of the low-voltage enhancement type device becomes a negative gate voltage of the high-voltage enhancement type device, thereby automatically providing a negative bias voltage necessary to achieve depletion type shutdown operations.

However, in the above-mentioned solution, the wires used in interconnection among the electrodes, e.g. the source electrodes, the drain electrodes and the gate electrodes, introduce parasitic inductance and parasitic resistance, which reduces switching speeds of signals and thus adversely affects the characteristics of high frequency and high speed of the gallium nitride power devices. Therefore, it is required to minimize the parasitic inductance and the parasitic resistance introduced in the cascade circuits.

SUMMARY

Aspects of the present invention are directed to a semiconductor package structure having minimized parasitic inductance and parasitic resistance.

According to an embodiment of the present invention, a semiconductor package structure comprises: a high-voltage depletion type semiconductor transistor comprising a source electrode, a gate electrode and a drain electrode; a low-voltage enhancement type semiconductor transistor comprising a source electrode, a gate electrode and a drain electrode; a shell comprising a cavity for receiving the high-voltage depletion type semiconductor transistor and the low-voltage enhancement type semiconductor transistor, and a high-voltage terminal, a first low-voltage terminal and a second low-voltage terminal; and cascade circuits. The cascade circuits comprise: a circuit for connecting the drain electrode of the high-voltage depletion type transistor and the high-voltage terminal of the shell; a circuit for connecting the gate electrode of the high-voltage depletion type semiconductor transistor, the source electrode of the low-voltage enhancement type semiconductor transistor and the first low-voltage terminal of the shell; a circuit for connecting the gate electrode of the low-voltage enhancement type transistor and the second low-voltage terminal of the shell. The cascade circuits further comprise a supporting sheet having a conductive surface. The source electrode of the high-voltage depletion type transistor and the drain electrode of the low-voltage enhancement type semiconductor transistor are fixed to the conductive surface of the supporting sheet and electrically connected to each other through the conductive surface of the supporting sheet. A side of the supporting sheet away from the conductive surface is fixed to the cavity of the shell.

The supporting sheet may further comprise a main body made of an insulating material, the conductive surface may be located on the main body and may be made of a conductive material. The main body may be made of a ceramic and the conductive surface may be made of a metal.

The high-voltage depletion type semiconductor transistor may comprise: a substrate; a channel layer located on the substrate and a barrier layer located on the channel layer, a two-dimensional electron gas being formed at an interface between the channel layer and the barrier layer; a source electrode ohmic metal and the drain electrode located on the channel layer, and the gate electrode located on the barrier layer; a via hole located at a back side of the source electrode ohmic metal and extending through the substrate; a via hole metal located inside the via hole and electrically connected to the source electrode ohmic metal; and a back metal located on a back side of the substrate and electrically connected to the via hole metal. Here, the source electrode ohmic metal, the via hole metal and the back metal form the source electrode of the high-voltage depletion type semiconductor transistor collectively.

The back metal of the high-voltage depletion type semiconductor transistor may be fixed on and electrically connected to the conductive surface of the supporting sheet.

The high-voltage depletion type semiconductor transistor may further comprise a gate dielectric layer and/or a surface passivation dielectric layer on the barrier layer.

The source electrode and the gate electrode of the low-voltage enhancement type semiconductor transistor may be located at a same side, and the drain electrode of the low-voltage enhancement type semiconductor transistor may be located at a side different from the side where the source electrode and the gate electrode of the low-voltage enhancement type semiconductor transistor are located.

The high-voltage depletion type semiconductor transistor may be a gallium nitride semiconductor transistor, and the low-voltage enhancement type semiconductor transistor may be a silicon semiconductor field effect transistor.

The low-voltage enhancement type semiconductor transistor may be an enhancement type semiconductor transistor having a vertical structure.

The drain electrode of the high-voltage depletion type transistor may be electrically connected with the high-voltage terminal of the shell through a wire. The gate electrode of the high-voltage depletion type semiconductor transistor, the source electrode of the low-voltage enhancement type semiconductor transistor and the first low-voltage terminal of the shell may be electrically connected through a wire. The gate electrode of the low-voltage enhancement type transistor may be electrically connected with the second low-voltage terminal of the shell through a wire.

At least one of the high-voltage terminal, the first low-voltage terminal and the second low-voltage terminal of the shell may include a conductive plate extending in a planar direction.

The semiconductor package structure may further comprise one or more resistive elements serially connected between the source electrode of the low-voltage enhancement type semiconductor transistor and the gate electrode of the high-voltage depletion type semiconductor transistor.

The semiconductor package structure may further comprise one or more capacitive elements parallel connected between the source electrode of the low-voltage enhancement type semiconductor transistor and the gate electrode of the high-voltage depletion type semiconductor transistor.

The source electrode of the high-voltage depletion type transistor and the drain electrode of the low-voltage enhancement type semiconductor transistor may be fixed to the conductive surface of the supporting sheet through a conductive adhesive.

The side of the supporting sheet away from the conductive surface may be fixed to the cavity of the shell through a non-conductive adhesive.

According to embodiments of the present invention, a back via hole technology is applied in the high-voltage depletion type semiconductor transistor, that is, the via hole metal, the back metal and the ohmic metal form the source electrode collectively. The source electrode of the high-voltage depletion type semiconductor transistor is electrically connected to the drain electrode of the low-voltage enhancement type semiconductor transistors through the supporting sheet, without usage of the wire. Therefore, the parasitic inductance and the parasitic resistance caused by the wire can be effectively reduced or substantially avoided, which improves performances of the semiconductor package structure.

In addition, in this embodiment, the processes of electric connections are simplified, which improves efficiency of assembling of the semiconductor package structure.

Further, since a source electrode via hole metal process is applied to the high-voltage depletion type semiconductor transistor, an area of the source electrode is expanded. With usage of the supporting sheet, a dissipating heat area of the source electrode is further expanded. In this way, an area for dissipating heat generated due to large current is expanded, which further improves heat dissipation performances of the device.

In addition, with usage of the supporting sheet, the space for assembling the two semiconductor transistors is decreased, and thus a space between electrodes of the semiconductor transistors is further decreased. In this way, lengths of connection wires are shortened. Therefore, not only parasitic inductance and parasitic resistance are further reduced, but also processing cost is lowered.

Furthermore, conductive plates of the terminals of the shell may be extended, thus the wires for interconnection among the electrodes of the transistors and the terminals of the shell are shortened, parasitic inductance and parasitic resistance introduced by wires can be further reduced and the performances of the semiconductor package structure can be further improved.

Also, one or more resistive elements or capacitive elements may be further included. In this way, when a given voltage is inputted, occurrence of electrical noise and electromagnetic interference may be reduced, thus preventing failures of gate driving and improving reliability of the semiconductor package structure.

BRIEF DESCRIPTION OF DRAWINGS

These and/or other aspects will become apparent and more readily appreciated from the following description of the embodiments, taken in conjunction with the accompanying drawings in which.

DETAILED DESCRIPTION

Figure 1:
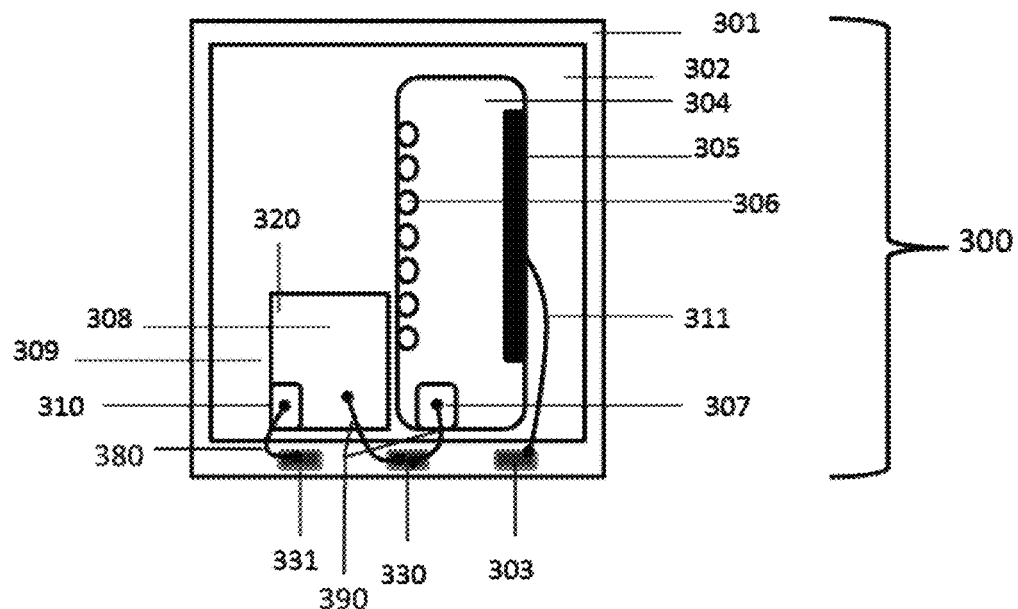
FIG. 1 is a schematic view illustrating a semiconductor package structure according to a first embodiment of the present invention.

Reference will now be made in detail to embodiments, examples of which are illustrated in the accompanying drawings, wherein like or similar reference numerals refer to like or similar elements throughout. In this regard, the present embodiments may have different forms and should not be construed as being limited to the descriptions set forth herein. Accordingly, the embodiments are merely described below, by referring to the figures, to explain aspects of the present description.

A first embodiment of the present invention will be described hereinafter with reference to FIGS. 1 to 4B.

FIG. 1 is a schematic view illustrating a semiconductor package structure according to a first embodiment of the present invention. As shown in FIG. 1, a semiconductor package structure 300 includes a high-voltage depletion type semiconductor transistor 304, a low-voltage enhancement type semiconductor transistor 320, a shell 301 and cascade circuits.

The shell 301 includes a cavity 301-1 (referring to FIG. 3A) for receiving the high-voltage depletion type semiconductor transistor 304 and the low-voltage enhancement type semiconductor transistor 320, as well as a high-voltage terminal 303, a first low-voltage terminal 330 and a second low-voltage terminal 331 formed on side walls of the cavity 301-1. In this embodiment, the shell 301 is not limited thereto, and may be any conventional shell.

The low-voltage enhancement type semiconductor transistor 320 may be a silicon semiconductor field effect transistor, preferably, is a low-voltage enhancement type transistor having a vertical structure. The low-voltage enhancement type semiconductor transistor 320 includes a source electrode 308, a drain electrode 309 and a gate electrode 310. The source electrode 308 and the gate electrode 310 are located on a same side, i.e. a side away from a supporting sheet 302 which will be described in detail later, the drain electrode 309 is located on the other side with respect to the source electrode 308 and the gate electrode 310, i.e., a side facing the supporting sheet 302.

The high-voltage depletion type semiconductor transistor 304 may be a gallium nitride semiconductor transistor, alternatively a high-voltage semiconductor transistor formed of another semiconductor material. A detailed structure of the high-voltage depletion type semiconductor transistor 304 will be described hereinafter with reference to FIG. 2.

Figure 2:
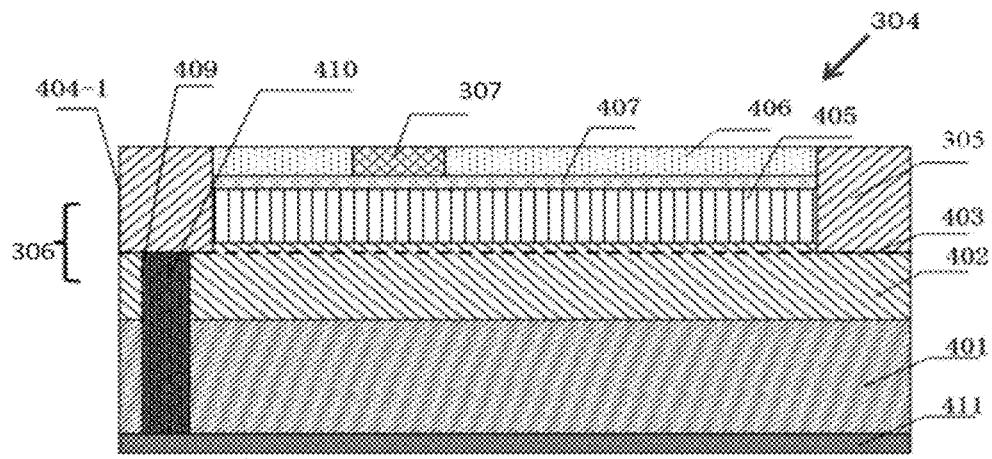
FIG. 2 is a schematic view illustrating a high-voltage depletion type semiconductor transistor shown in FIG. 1.

FIG. 2 is a schematic view illustrating a high-voltage depletion type semiconductor transistor shown in FIG. 1. As shown in FIG. 2, the high-voltage depletion type semiconductor transistor 304 includes: a substrate 401; a channel layer 402 located on the substrate 401 and a barrier layer 405 located on the channel layer 402, two-dimensional electron gas 403 being formed at an interface between the channel layer 402 and the barrier layer 405; a source electrode ohmic metal 404-1 and a drain electrode 305 located on the channel layer 402 as well as a gate electrode 307 located on the barrier layer 405.

In this embodiment, the high-voltage depletion type semiconductor transistor 304 further comprises: a via hole 409 located on a back side of the source electrode ohmic metal 404-1 and extending through the substrate 401, i.e. extending from a side of the source electrode ohmic metal 404-1 facing the substrate 401 to a side of the substrate 401 away from the channel layer 402; a via hole metal 410 located inside the via hole 409 and electrically connected to the source electrode ohmic metal 404-1; a back metal 411 located on a back side of the substrate 401, i.e., the side of the substrate 401 away from the channel layer 402, and electrically connected to the via hole metal 410. In this way, the source electrode ohmic metal 404-1, the via hole metal 410 and the back metal 411 collectively form a source electrode 306 of the high-voltage depletion type semiconductor transistor 304.

Preferably, as shown in FIG. 2, the barrier layer 405 may be further covered with a gate dielectric layer 407 and a surface passivation dielectric layer 406. The gate dielectric layer 407 is mainly used to adjust a control voltage of the two-dimensional electronic gas 403 in a channel below the gate electrode 307 of the high-voltage depletion type semiconductor transistor 304 so as to adjust a gate threshold voltage of the high-voltage depletion type semiconductor transistor 304, while used to improve the interface under the gate metal material so as to reduce a gate leakage current. The surface passivation dielectric layer 406 is used to effectively reduce a surface state concentration of material so as to inhibit or reduce occurrence of a current collapse effect in the high-voltage depletion type semiconductor transistor 304. Those skilled in the art will appreciate that one or both of the gate dielectric layer 407 and the surface passivation dielectric layer 406 may be omitted.

Figure 3A:
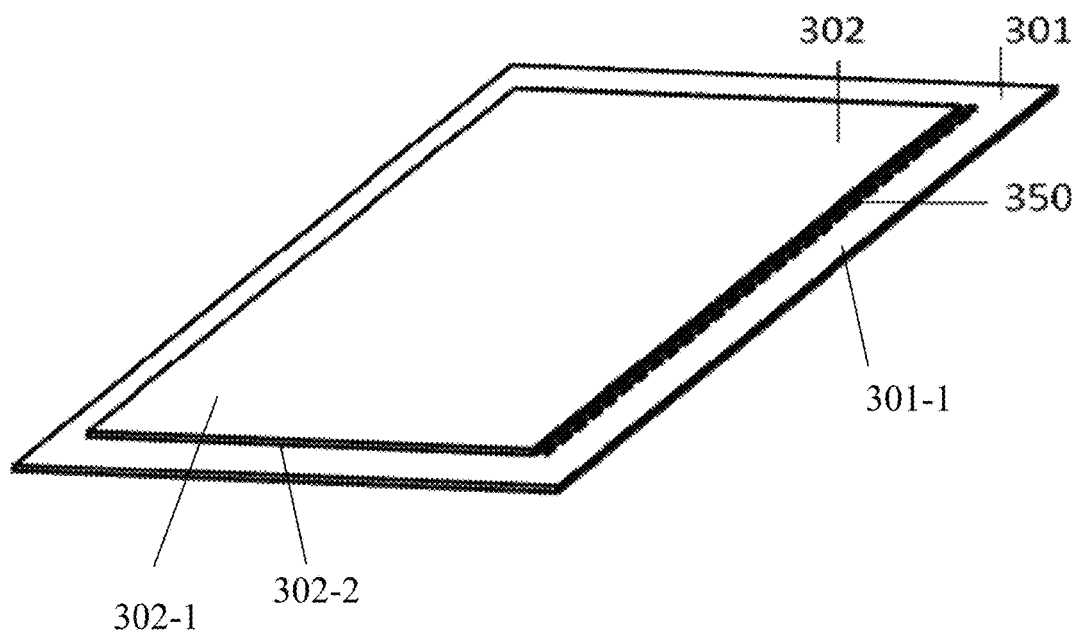
FIGS. 3A, 3B and 3C are schematic views illustrating a process of assembling the semiconductor package structure.
Figure 3B:
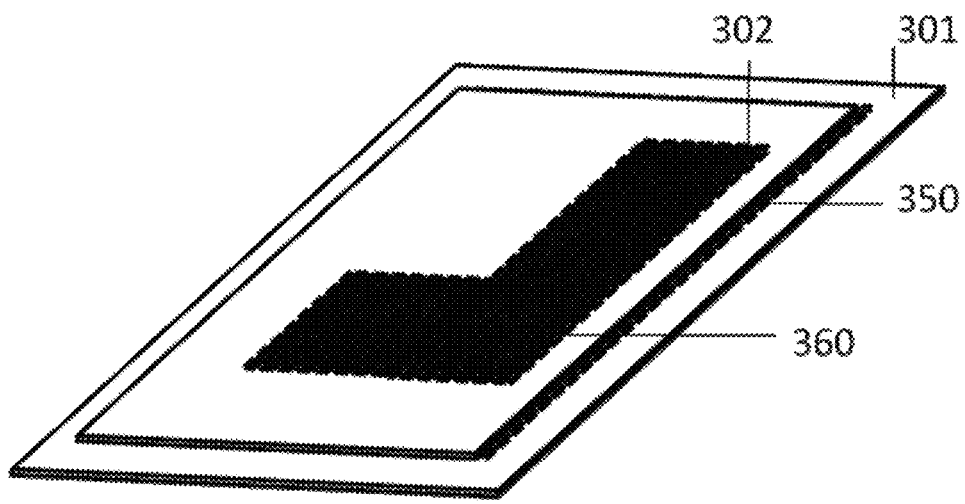
Figure 3C:
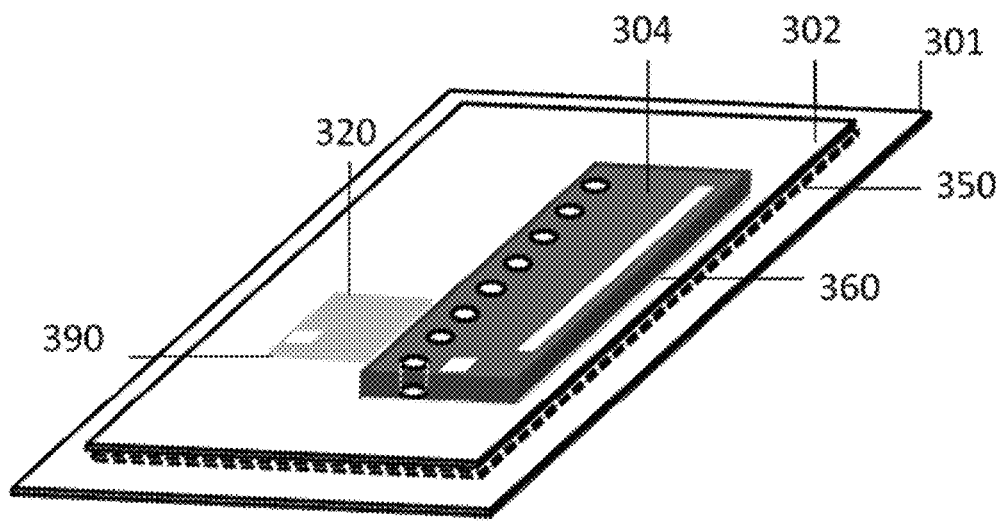

Referring back to FIG. 1, in this embodiment, the cascade circuits include the supporting sheet 302. Also referring to FIGS. 3A, 3B and 3C illustrating a process of assembling the semiconductor package structure, especially FIG. 3A, in this embodiment, the supporting sheet 302 is a thin sheet in general, and comprises a main body 302-2 and a conductive surface 302-1 located on the main body 302-2. The main body 302-2 is made of an insulating material, such as a ceramic, but the present invention is not limited thereto, the main body 302-2 may be made of any insulating material. The conductive surface 302-1 is made of a conductive material with relatively low resistivity, e.g. a metal, such as copper (Cu) or gold (Au), etc., but the present invention is not limited thereto, the conductive surface 302-1 may be made of any conductive material. The conductive surface 302-1 may be formed on the main body 302-2 by coating or plating.

In this embodiment, the supporting sheet 302 is generally a thin sheet, but the present invention is not limited thereto, a shape and a size of the supporting sheet 302 may be determined based on a size of the cavity 301-1 of the shell 301 and areas of the high-voltage depletion type semiconductor transistor 304 and the low-voltage enhancement type semiconductor transistor 320.

In this embodiment, besides the supporting sheet 302, the cascade circuits further include a circuit for connecting the drain electrode 305 of the high-voltage depletion type semiconductor transistor 304 and the high-voltage terminal 303 of the shell 301; a circuit for connecting the source electrode 308 of the low-voltage enhancement type semiconductor transistor 320, the gate electrode 307 of the high-voltage depletion type semiconductor transistor 304 and the first low-voltage terminal 330 of the shell 301; a circuit for connecting the gate electrode 310 of the low-voltage enhancement type semiconductor transistor 320 and the second low-voltage terminal 331 of the shell 301.

For example, the drain electrode 305 of the high-voltage depletion type semiconductor transistor 304 is electrically connected to the high-voltage terminal 303 of the shell 301 through a wire 311; the source electrode 308 of the low-voltage enhancement type semiconductor transistor 320 is electrically connected to the gate electrode 307 of the high-voltage depletion type semiconductor transistor 304, then both of them are electrically connected to the first low-voltage terminal 330 of the shell 301 through a wire 390; the gate electrode 310 of the low-voltage enhancement type semiconductor transistor 320 is electrically connected to the second low-voltage terminal 331 of the shell 301 through a wire 380. Here, the wires 311, 390 and 380 and the supporting sheet 302 described above collectively form the cascade circuits in this embodiment.

An assembling process of the semiconductor package structure will be described hereinafter with reference to FIGS. 3A to 3C.

First, as shown in FIG. 3A, a non-conductive adhesive 350 is coated on a bottom surface, i.e., a surface away from the conductive surface 302-1, of the main body 302-2 of the supporting sheet 302, and then the supporting sheet 302 is fixed to an interior bottom surface of the cavity 301-1 of the shell 301. It is noted that the supporting sheet 302 is insulant from any part of the shell 301. In addition, those skilled in the art will appreciate that the non-conductive adhesive 350 can be coated on the interior bottom surface of the cavity 301-1 of the shell 301 firstly, and then the supporting sheet 302 is fixed to the shell 301 through the non-conductive adhesive 350. Here, the non-conductive adhesive 350 may be any conventional non-conductive adhesive.

Next, as shown in FIG. 3B, a conductive adhesive 360 is coated on the conductive surface 302-1 of the supporting sheet 302, based on areas of bottom surfaces of the high-voltage depletion type semiconductor transistor 304 and the low-voltage enhancement type semiconductor transistor 320 as well as predetermined installing positions. Here, the conductive adhesive 360 may be any conventional conductive adhesive. Preferably, the conductive adhesive 360 has a high thermal conductivity.

Next, as shown in FIG. 3C, a bottom surface, i.e., a surface on which the back metal 411 is formed, of the high-voltage depletion type semiconductor transistor 304 and a bottom surface, i.e., a surface on which the drain electrode 309 is formed, of the low-voltage enhancement type semiconductor transistor 320, are fixed to the same supporting sheet 302 through the conductive adhesive 360 coated on the conductive surface 302-1 of the supporting sheet 302. That is, the source electrode 306 of the high-voltage depletion type semiconductor transistor 304 and the drain electrode 309 of the low-voltage enhancement type semiconductor transistor 320 are electrically connected via the same supporting sheet 302, without a wire like in the prior art, thereby substantially avoiding the parasitic resistance and the parasitic inductance caused by the wire, thus minimizing the parasitic resistance and the parasitic inductance between the source electrode 306 of the high-voltage depletion type semiconductor transistor 304 and the drain electrode 309 of the low-voltage enhancement type semiconductor transistor 320.

Finally, although not shown, the drain electrode 305 of the high-voltage depletion type semiconductor transistor 304 is electrically connected to the high-voltage terminal 303 of the shell 301 through the wire 311; the source electrode 308 of the low-voltage enhancement type semiconductor transistor 320 is electrically connected to the gate electrode 307 of the high-voltage depletion type semiconductor transistor 304, then both of them are electrically connected to the first low-voltage terminal 330 of the shell 301 through the wire 390; the gate electrode 310 of the low-voltage enhancement type semiconductor transistor 320 is electrically connected to the second low-voltage terminal 331 of the shell 301 through the wire 380. The processes are similar to those in the prior art, and therefore a detailed description thereof is omitted.

In the assembled semiconductor package structure, a drain voltage $V_{DS}$ of the low-voltage enhancement type semiconductor transistor 320 becomes a negative gate voltage $V_{GS}$ of the high-voltage depletion type semiconductor transistor 304, so that a required negative bias is automatically provided and turn-off operations of the high-pressure depletion type semiconductor transistor 304 can be achieved.

In this embodiment, a back via hole technology is applied in the high-pressure depletion type semiconductor transistor 304, that is, the via hole metal 410, the back metal 411 and the ohmic metal 404-1 form the source electrode 306 collectively. The source electrode 306 is electrically connected to the drain electrode 309 of the low-voltage enhancement type semiconductor transistors 320 through the supporting sheet 302, without usage of a wire. Therefore, parasitic inductance and parasitic resistance caused by a wire can be effectively reduced or substantially avoided, which improves performances of the semiconductor package structure.

In addition, in this embodiment, the processes of electric connections are simplified, which improves efficiency of assembling of the semiconductor package structure.

Further, since a source electrode via hole metal process is applied to the high-voltage depletion type semiconductor transistor 304, an area of the source electrode 306 is expanded. With usage of the supporting sheet 302, a dissipating heat area of the source electrode 306 is further expanded. In this way, an area for dissipating heat generated due to large current is expanded, which further improves heat dissipation performances of the device.

In addition, with usage of the supporting sheet 302, a space for assembling the two semiconductor transistors 304 and 320 is decreased, and thus a space between electrodes of the semiconductor transistors 304 and 320 is further decreased. In this way, lengths of connection wires are shortened. Therefore, not only parasitic inductance and parasitic resistance are further reduced, but also processing cost is lowered.

Hereinafter FIGS. 4A and 4B will be referred to compare an effect of reduction of parasitic inductance according to this embodiment.

Figure 4A:
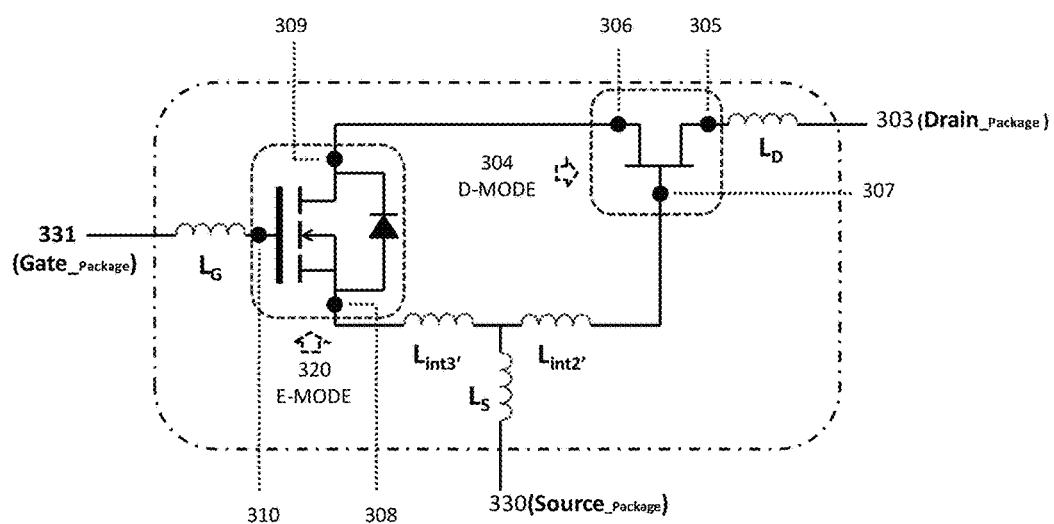
FIG. 4A is a schematic circuit diagram illustrating inductance distribution of the semiconductor package structure according to the first embodiment of the present invention.
Figure 4B:
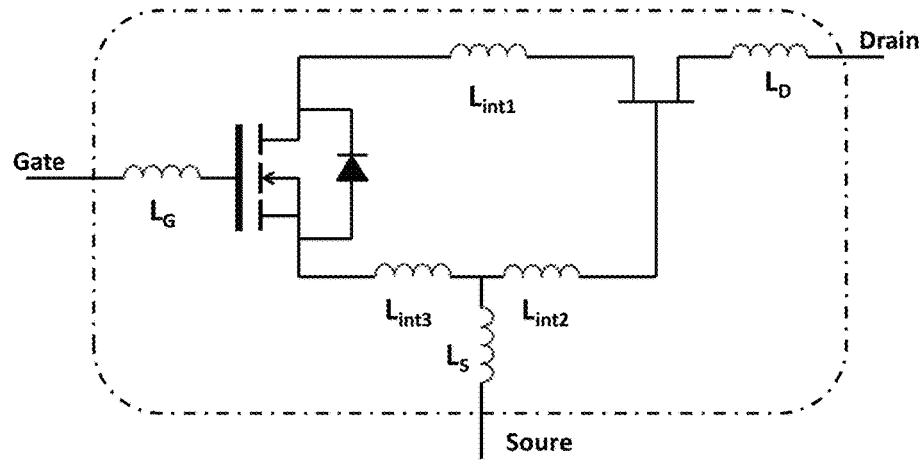
FIG. 4B is a schematic circuit diagram illustrating inductance distribution of a semiconductor package structure according to a comparative embodiment of the prior art.

FIG. 4A is a schematic circuit diagram illustrating inductance distribution of the semiconductor package structure according to the first embodiment of the present invention, while FIG. 4B is a schematic circuit diagram illustrating inductance distribution of a semiconductor package structure according to a comparative embodiment of the prior art.

The inductance distribution shown in FIG. 4A is produced based on the semiconductor package structure according to this embodiment, while the inductance distribution shown in FIG. 4B is produced based on the semiconductor package structure according to the prior art. In FIGS. 4A and 4B, $L_S$, $L_D$ and $L_G$ respectively represent inductance of the source electrode terminal, the drain electrode terminal and the gate electrode terminal of the semiconductor package structure according to this embodiment and those according to the prior art; $L_{int1}$ represents parasitic inductance between the source electrode of the high-voltage depletion type semiconductor transistor and the drain electrode of the low-voltage enhancement type semiconductor transistor according to this embodiment; $L_{int2'}$ and $L_{int2}$ respectively represent parasitic inductance between the source electrode of the semiconductor package structure and the gate electrode of the high-voltage depletion type semiconductor transistor according to this embodiment and that according to the prior art; $L_{int3'}$ and $L_{int3}$ respectively represent parasitic inductance between the source electrode of the semiconductor package structure and the source electrode of the high-voltage depletion type semiconductor transistor according to this embodiment and that according to the prior art.

Comparing FIGS. 4A and 4B, since the supporting sheet 302, rather than a wire, is used to connect the source electrode 306 of the high-voltage depletion type semiconductor transistor 304 and the drain electrode 309 of the low-voltage enhancement type semiconductor transistor 320, the parasitic inductance therebetween is zero or substantial zero. Thus it could be seen that parasitic inductance and the parasitic resistance between the source electrode 306 of the high-voltage depletion type semiconductor transistor 304 and the drain electrode 309 of the low-voltage enhancement type semiconductor transistor 320 are effectively avoided.

Furthermore, as described before, by using the supporting sheet 302, the space between electrodes of the two semiconductor transistors 304 and 320 as well as terminals of the shell 301 is decreased, and thus the connection wires are shortened. Therefore, the parasitic inductance $L_{int2'}$ between the source electrode of the semiconductor package structure, i.e. the first low-voltage terminal 330 of the shell 301, and the gate electrode 307 of the high-voltage depletion type semiconductor transistor 304 is reduced, that is, $L_{int2'} < L_{int2}$, and the parasitic inductance $L_{int3'}$ between the source electrode of the package structure, i.e. the first low-voltage terminal 330 of the shell 301, and the source electrode 308 of the low-voltage enhancement type semiconductor transistor 320 is reduced, that is, $L_{int3'} < L_{int3}$.

Hereinafter a second embodiment of the present invention will be described with reference to FIG. 5A.

Figure 5A:
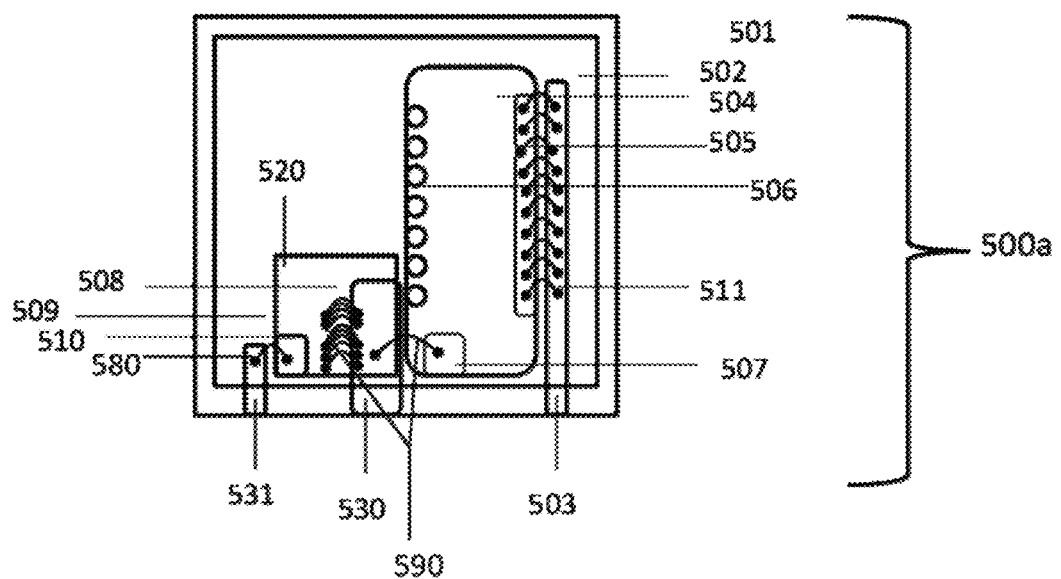
FIG. 5A is a schematic view illustrating a semiconductor package structure according to a second embodiment of the present invention.

FIG. 5A is a schematic view illustrating a semiconductor package structure according to the second embodiment of the present invention. As shown in FIG. 5A, different from the first embodiment, in a semiconductor package structure 500a according to this embodiment, conductive plates of a high-voltage terminal 503, a first low-voltage terminal 530 and a second low-voltage terminal 531 of a shell 501 are extended in a planar direction (a horizontal direction), i.e., in a direction parallel to the interior bottom surface of the cavity of the shell 501. However, this invention is not limited thereto. Instead, only one or two of the high-voltage terminal 503, the first low-voltage terminal 530 and the second low-voltage terminal 531 of the shell 501 may have extended conductive plates.

In addition, a drain electrode 505 of a high-voltage depletion type semiconductor transistor 504 is electrically connected to the high-voltage terminal 503 of the shell 501 through a wire 511; a source electrode 508 of a low-voltage enhancement type semiconductor transistor 520 is electrically connected to a gate electrode 507 of the high-voltage depletion type semiconductor transistor 504, then both of them are electrically connected to the first low-voltage terminal 530 of the shell 501 through a wire 590; a source electrode 506 of the high-voltage depletion type semiconductor transistor 504 is electrically connected to a drain electrode 509 of the low-voltage enhancement type semiconductor transistor 520 through a supporting sheet 502; and a gate electrode 510 of the low-voltage enhancement type semiconductor transistor 520 is electrically connected to the second low-voltage terminal 531 of the shell 501 through a wire 580.

Except for the above-described differences, the second embodiment is substantially the same as the first embodiment, thus repeated descriptions are omitted.

Compared to the cascade circuits according to the first embodiment of the present invention, since conductive plates of the terminals 503, 530 and 531 of the shell 501 are extended, the wires for interconnection among the electrodes of the transistors and the terminals of the shell are shortened, thus parasitic inductance and parasitic resistance introduced by wires can be further reduced and the performances of the semiconductor package structure can be further improved.

Hereinafter a third embodiment of the present invention will be described with reference to FIG. 5B.

Figure 5B:
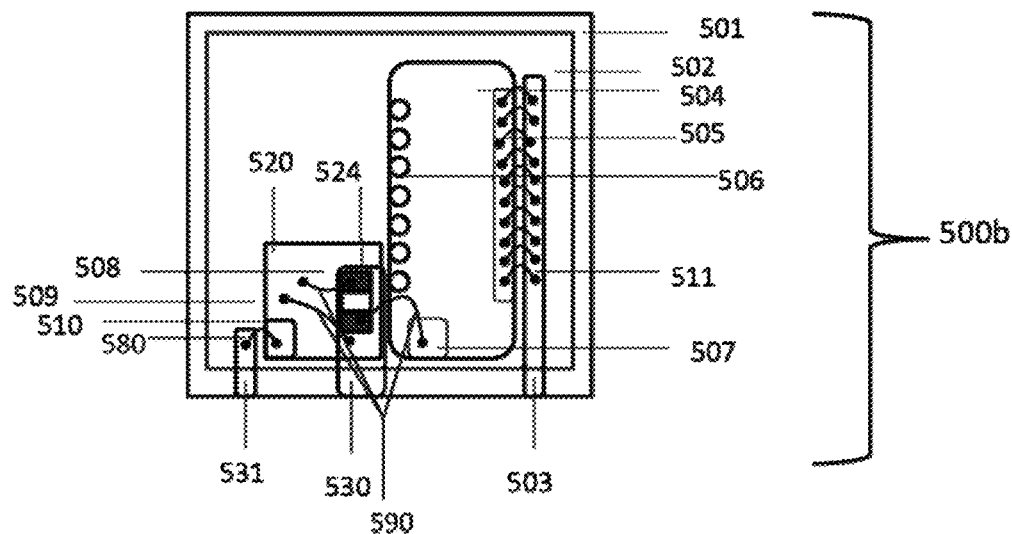
FIG. 5B is a schematic view illustrating a semiconductor package structure according to a third embodiment of the present invention.

FIG. 5B is a schematic view illustrating a semiconductor package structure according to a third embodiment of the present invention. As shown in FIG. 5B, different from the second embodiment, in a semiconductor package structure 500b according to this embodiment, one or more resistive elements 524 are further included, e.g., serially connected, between the source electrode 508 of the low-voltage enhancement type semiconductor transistor 520 and the gate electrode 507 of the high-voltage depletion type semiconductor transistor 504. That is, the source electrode 508 of the low-voltage enhancement type semiconductor transistor 520 is electrically connected to the gate electrode 507 of the high-voltage depletion type semiconductor transistor 504 through the one or more resistive elements 524.

Except for the above-described differences, the third embodiment is substantially the same as the second embodiment, thus repeated descriptions are omitted.

Compared to the cascade circuits according to the second embodiment of the present invention, since the one or more resistive elements 524 are further included, when a given voltage is inputted, the increased resistance limits a signal conversion rate, reduces occurrence of electrical noise and electromagnetic interference, thus preventing failures of gate driving and improving reliability of the semiconductor package structure.

Hereinafter a fourth embodiment of the present invention will be described with reference to FIG. 5C.

Figure 5C:
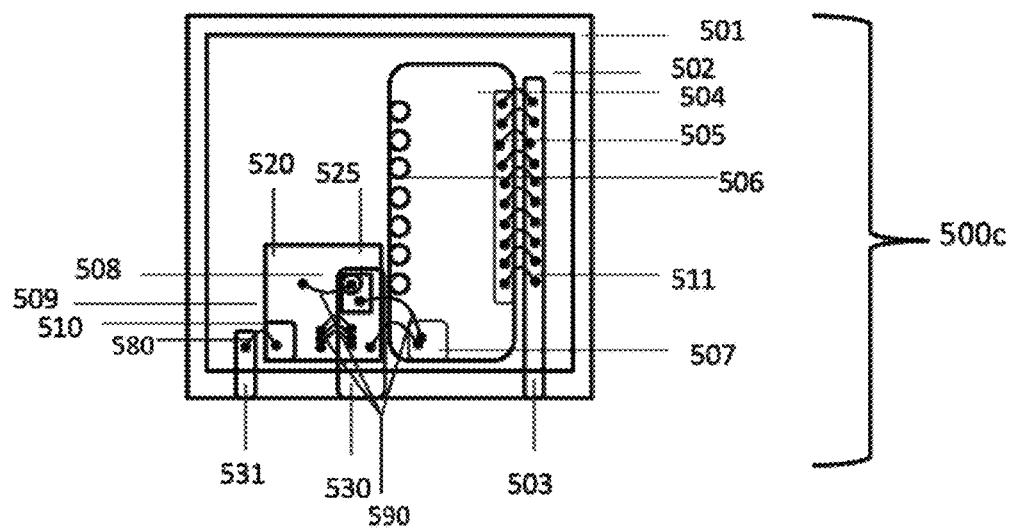
FIG. 5C is a schematic view illustrating a semiconductor package structure according to a fourth embodiment of the present invention.

FIG. 5C is a schematic view illustrating a semiconductor package structure according to a fourth embodiment of the present invention. As shown in FIG. 5C, different from the second embodiment, in a semiconductor package structure 500c according to this embodiment, one or more capacitive elements 525 are further included, e.g., parallel connected between the source electrode 508 of the low-voltage enhancement type semiconductor transistor 520 and the gate electrode 507 of the high-voltage depletion type semiconductor transistor 504.

Except for the above-described differences, the fourth embodiment is substantially the same as the second embodiment, thus repeated descriptions are omitted.

Compared to the cascade circuits according to the second embodiment of the present invention, since the one or more capacitive elements 525 are further included, when a given voltage is inputted, the increased capacity reduces occurrence of electrical noise and electromagnetic interference, thus preventing failures of gate driving and improving reliability of the semiconductor package structure.

While the third embodiment and the fourth embodiment are described on the basis of the second embodiment, those skilled in the art will appreciate that they can be realized on the basis of the first embodiment. That is, resistive elements and/or capacitive elements can be further included in the semiconductor package structure, without extending the conductive plates of the terminals of the shell.

It should be understood that the embodiments described herein should be considered in a descriptive sense only and not for purposes of limitation. Descriptions of features or aspects within each embodiment should typically be considered as available for other similar features or aspects in other embodiments.

While embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A semiconductor package structure, comprising:
   a high-voltage depletion type semiconductor transistor comprising a source electrode, a gate electrode and a drain electrode;
   a low-voltage enhancement type semiconductor transistor comprising a source electrode, a gate electrode and a drain electrode;
   a shell comprising a cavity for receiving the high-voltage depletion type semiconductor transistor and the low-voltage enhancement type semiconductor transistor, and a high-voltage terminal, a first low-voltage terminal and a second low-voltage terminal; and
   cascade circuits, comprising: a circuit for connecting the drain electrode of the high-voltage depletion type transistor and the high-voltage terminal of the shell; a circuit for connecting the gate electrode of the high-voltage depletion type semiconductor transistor, the source electrode of the low-voltage enhancement type semiconductor transistor and the first low-voltage terminal of the shell; a circuit for connecting the gate electrode of the low-voltage enhancement type transistor and the second low-voltage terminal of the shell,
   wherein the cascade circuits further comprise a supporting sheet having a conductive surface; the source electrode of the high-voltage depletion type transistor and the drain electrode of the low-voltage enhancement type semiconductor transistor are fixed to the conductive surface of the supporting sheet and electrically connected to each other through the conductive surface of the supporting sheet; and a side of the supporting sheet away from the conductive surface is fixed to the cavity of the shell;
   wherein at least one of the high-voltage terminal, the first low-voltage terminal, and the second low-voltage terminal includes a conductive plate extending to a position above the supporting sheet.

2. The semiconductor package structure according to claim 1, wherein the supporting sheet further comprises a main body made of an insulating material, the conductive surface is located on the main body and is made of a conductive material.

3. The semiconductor package structure according to claim 2, wherein the main body is made of a ceramic and the conductive surface is made of a metal.

4. The semiconductor package structure according to claim 1, wherein the high-voltage depletion type semiconductor transistor comprises:
   a substrate;
   a channel layer located on the substrate and a barrier layer located on the channel layer, a two-dimensional electron gas being formed at an interface between the channel layer and the barrier layer;
   a source electrode ohmic metal and the drain electrode located on the channel layer, and the gate electrode located on the barrier layer;
   a via hole located at a back side of the source electrode ohmic metal and extending through the substrate;
   a via hole metal located inside the via hole and electrically connected to the source electrode ohmic metal; and
   a back metal located on a back side of the substrate and electrically connected to the via hole metal,
   wherein the source electrode ohmic metal, the via hole metal and the back metal form the source electrode of the high-voltage depletion type semiconductor transistor collectively.

5. The semiconductor package structure according to claim 4, wherein the back metal of the high-voltage depletion type semiconductor transistor is fixed on and electrically connected to the conductive surface of the supporting sheet.

6. The semiconductor package structure according to claim 4, wherein the high-voltage depletion type semiconductor transistor further comprises a gate dielectric layer and/or a surface passivation dielectric layer on the barrier layer.

7. The semiconductor package structure according to claim 1, wherein the source electrode and the gate electrode of the low-voltage enhancement type semiconductor transistor are located at a same side, and the drain electrode of the low-voltage enhancement type semiconductor transistor is located at a side different from the side where the source electrode and the gate electrode of the low-voltage enhancement type semiconductor transistor are located.

8. The semiconductor package structure according to claim 1, wherein the high-voltage depletion type semiconductor transistor is a gallium nitride semiconductor transistor, and the low-voltage enhancement type semiconductor transistor is a silicon semiconductor field effect transistor.

9. The semiconductor package structure according to claim 1, wherein the low-voltage enhancement type semiconductor transistor is an enhancement type semiconductor transistor having a vertical structure.

10. The semiconductor package structure according to claim 1, wherein:
    the drain electrode of the high-voltage depletion type transistor is electrically connected with the high-voltage terminal of the shell through a wire;
    the gate electrode of the high-voltage depletion type semiconductor transistor, the source electrode of the low-voltage enhancement type semiconductor transistor and the first low-voltage terminal of the shell are electrically connected through a wire; and
    the gate electrode of the low-voltage enhancement type transistor is electrically connected with the second low-voltage terminal of the shell through a wire.

11. The semiconductor package structure according to claim 1, wherein at least one of the high-voltage terminal, the first low-voltage terminal and the second low-voltage terminal of the shell includes a conductive plate extending in a planar direction.

12. The semiconductor package structure according to claim 11, further comprising one or more resistive elements serially connected between the source electrode of the low-voltage enhancement type semiconductor transistor and the gate electrode of the high-voltage depletion type semiconductor transistor.

13. The semiconductor package structure according to claim 1, further comprising one or more resistive elements serially connected between the source electrode of the low-voltage enhancement type semiconductor transistor and the gate electrode of the high-voltage depletion type semiconductor transistor.

14. The semiconductor package structure according to claim 1, wherein the source electrode of the high-voltage depletion type transistor and the drain electrode of the low-voltage enhancement type semiconductor transistor are fixed to the conductive surface of the supporting sheet through a conductive adhesive.

15. The semiconductor package structure according to claim 14, wherein the conductive adhesive has a high thermal conductivity.

16. The semiconductor package structure according to claim 1, wherein the side of the supporting sheet away from the conductive surface is fixed to the cavity of the shell through a non-conductive adhesive.

\* \* \* \* \*